United States Patent
Venu et al.

(10) Patent No.: US 11,022,649 B2
(45) Date of Patent: *Jun. 1, 2021

(54) STABILISED FAILURE ESTIMATE IN CIRCUITS

(71) Applicant: Arm Limited, Cambridge (GB)

(72) Inventors: Balaji Venu, Cambridge (GB); Reiley Jeyapaul, Austin, TX (US)

(73) Assignee: Arm Limited, Cambridge (GB)

( * ) Notice: Subject to any disclaimer, the term of this patent is extended or adjusted under 35 U.S.C. 154(b) by 33 days.

This patent is subject to a terminal disclaimer.

(21) Appl. No.: 16/512,911

(22) Filed: Jul. 16, 2019

(65) Prior Publication Data
US 2020/0174072 A1    Jun. 4, 2020

Related U.S. Application Data

(63) Continuation-in-part of application No. 16/206,189, filed on Nov. 30, 2018, now Pat. No. 10,747,601.

(51) Int. Cl.
| | |
|---|---|
| *G06F 30/367* | (2020.01) |
| *G06F 30/33* | (2020.01) |
| *G06F 30/30* | (2020.01) |
| *G01R 31/00* | (2006.01) |
| *G01R 31/317* | (2006.01) |
| *G06F 11/00* | (2006.01) |

(52) U.S. Cl.
CPC ..... *G01R 31/31718* (2013.01); *G06F 30/367* (2020.01); *G06F 11/008* (2013.01); *G06F 30/30* (2020.01); *G06F 30/33* (2020.01)

(58) Field of Classification Search
CPC ............. G06F 17/5022; G06F 17/5036; G06F 17/5045; G06F 11/008; G06F 30/367; G06F 30/33; G06F 30/30; G01R 31/31718

USPC .......... 716/136, 106, 112, 113, 108; 703/16; 702/79, 118; 714/30, 33, 36, 37, 48, 732, 714/741

See application file for complete search history.

(56) References Cited

U.S. PATENT DOCUMENTS

| | | | |
|---|---|---|---|
| 10,523,186 B1* | 12/2019 | Venu | G01R 31/318342 |
| 10,747,601 B2* | 8/2020 | Jeyapaul | G06F 30/30 |
| 10,771,193 B2* | 9/2020 | Walter | H03M 13/3738 |
| 2005/0246613 A1* | 11/2005 | Blaauw | G06F 9/3861 714/763 |
| 2006/0220716 A1* | 10/2006 | Nicolaidis | H03K 3/013 327/199 |

(Continued)

OTHER PUBLICATIONS

U.S. Appl. No. 16/206,189, filed Nov. 30, 2018, Inventor: Jeyapaul et al.

(Continued)

*Primary Examiner* — Phallaka Kik
(74) *Attorney, Agent, or Firm* — Nixon & Vanderhye P.C.

(57) ABSTRACT

An apparatus is provided to measure vulnerability of a circuit to transient errors. The circuit includes processing circuitry and a plurality of flops. The apparatus includes categorisation obtaining circuitry that obtains a vulnerability categorisation of the flops. The vulnerability categorisation indicates whether each flop is vulnerable, conditionally vulnerable, or isolated. Analysis circuitry determines, for at least one cycle of the processing circuitry, a set of the flops that are currently vulnerable, based on the vulnerability categorisation of the flops.

20 Claims, 15 Drawing Sheets

(56) References Cited

U.S. PATENT DOCUMENTS

| | | | | |
|---|---|---|---|---|
| 2007/0162798 A1* | 7/2007 | Das | ............... | G06F 11/1695 |
| | | | | 714/724 |
| 2009/0083596 A1* | 3/2009 | Gizdarski | ............. | G06F 30/327 |
| | | | | 714/729 |
| 2009/0249175 A1* | 10/2009 | Chandra | ................ | G06F 11/00 |
| | | | | 714/822 |
| 2010/0251046 A1* | 9/2010 | Mizuno | ............ | G01R 31/31937 |
| | | | | 714/726 |
| 2010/0306489 A1* | 12/2010 | Abts | ................ | G06F 12/1483 |
| | | | | 711/163 |
| 2012/0079346 A1* | 3/2012 | Fukuda | ................ | H03M 13/09 |
| | | | | 714/758 |
| 2013/0061104 A1* | 3/2013 | Hartl | ............. | G01R 31/318357 |
| | | | | 714/741 |
| 2018/0359054 A1* | 12/2018 | Walter | ................ | H04L 1/0061 |
| 2019/0369884 A1* | 12/2019 | Miura | ................ | G06F 11/0727 |

OTHER PUBLICATIONS

U.S. Appl. No. 16/206,234, filed Nov. 30, 2018, Inventor: Venu et al.

Bedichek, "Some Efficient Architecture Simulation Techniques", Winter 1990 USENIX Conference, 12 pages.

Biswas et al., "Quantized AVF: A Means of Capturing Vulnerability Variations over Small Windows of Time", IEEE Workshop on Silicon Errors in Logic—System Effects, Mar. 2009, 8 pages.

\* cited by examiner

FIG. 15

$F_{Flop}^{Vul} = \frac{1}{5} = 0.2$ $= \frac{4}{5} = 0.8$ $= \frac{2}{5} = 0.4$ $= \frac{1}{5} = 0.2$ Block execution table

| CLK | 1 | 2 | 3 | 4 | 5 |
|---|---|---|---|---|---|
| PREFETCH | ✓ | | | | ✓ |
| BUFFER SLOT 1 | | ✓ | ✓ | | ✓ |
| BUFFER SLOT 2 | | ✓ | ✓ | | |
| BUFFER SLOT 3 | | | ✓ | | |

STABILISED FAILURE ESTIMATE IN CIRCUITS

This application is a Continuation-in-Part of U.S. application Ser. No. 16/206,189 filed 30 Nov. 2018 (now U.S. Pat. No. 10,747,601), the entire contents of which is hereby incorporated by reference.

TECHNICAL FIELD

The present disclosure relates to data processing. More particularly, it relates to the analysis of failure of data processing circuits.

DESCRIPTION

Safety or Reliability analysis is concerned with the probability of part or all of a circuit failing as a consequence of, for instance, a transient error occurring with one of the flops on that circuit. Previously proposed techniques consider the extent to which flops or circuit blocks are active or utilised during execution of a specific program. However, the activity or utilization of a flop or circuit block might not represent the actual reliability of the block. It is desirable for such analysis to be accurate so as to provide a better view of the reliability or safeness of a circuit. It is further desirable for such analysis to be relatively consistent so that the results of such analysis can be trusted.

SUMMARY

Viewed from a first example configuration, there is provided an apparatus to measure vulnerability of a circuit to transient errors, the circuit comprising processing circuitry and a plurality of flops, the apparatus comprising: categorisation obtaining circuitry to obtain a vulnerability categorisation of the flops, wherein the vulnerability categorisation indicates whether each flop is vulnerable, conditionally vulnerable, or isolated; and analysis circuitry to determine, for at least one cycle of the processing circuitry, a set of the flops that are currently vulnerable, based on the vulnerability categorisation of the flops.

Viewed from a second example configuration, there is provided a method of measuring vulnerability of a circuit to transient errors, the circuit comprising processing circuitry and a plurality of flops, the method comprising: obtaining a vulnerability categorisation of the flops, wherein the vulnerability categorisation indicates whether each flop is vulnerable, conditionally vulnerable, or isolated; and analysing, for at least one cycle of the processing circuitry, a set of the flops that are currently vulnerable, based on the vulnerability categorisation of the flops.

Viewed from a third example configuration, there is provided a non-transient computer readable medium containing program instructions for causing a computer to perform a method of measuring vulnerable of a circuit to transient errors, the circuit comprising processing circuitry and a plurality of flops, the method comprising: obtaining a vulnerability categorisation of the flops, wherein the vulnerability categorisation indicates whether each flop is vulnerable, conditionally vulnerable, or isolated; and analysing, for at least one cycle of the processing circuitry, a set of the flops that are currently vulnerable, based on the vulnerability categorisation of the flops.

BRIEF DESCRIPTION OF THE DRAWINGS

The present invention will be described further, by way of example only, with reference to embodiments thereof as illustrated in the accompanying drawings, in which:

FIG. 15 illustrates how adjustment circuitry can make a determination as to whether a storage circuit or module should be disabled, in accordance with some embodiments.

DESCRIPTION OF EXAMPLE EMBODIMENTS

Figure 1:
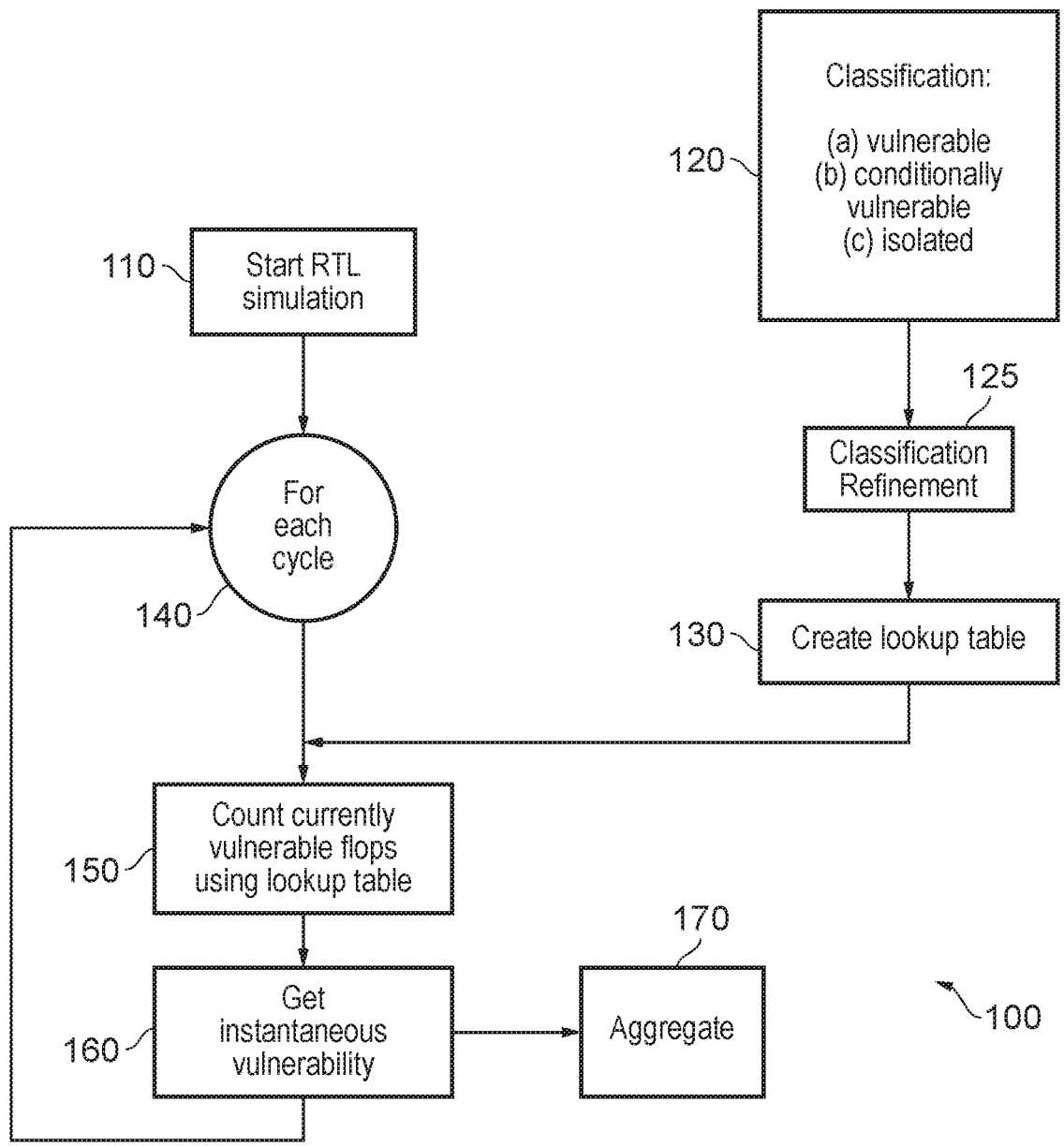
FIG. 1 illustrates a flow chart that shows a process of determining the vulnerability or the safeness of a circuit using simulation in accordance with some embodiments.

Before discussing the embodiments with reference to the accompanying figures, the following description of embodiments is provided.

In accordance with one example configuration there is provided an apparatus to measure vulnerability of a circuit to transient errors, the circuit comprising processing circuitry and a plurality of flops, the apparatus comprising: categorisation obtaining circuitry to obtain a vulnerability categorisation of the flops, wherein the vulnerability categorisation indicates whether each flop is vulnerable, conditionally vulnerable, or isolated; and analysis circuitry to determine, for at least one cycle of the processing circuitry, a set of the flops that are currently vulnerable, based on the vulnerability categorisation of the flops.

The above configuration considers the safeness or reliability of a circuit based on the vulnerability of flops within that circuit. Transient errors can occur as a consequence of cosmic rays, cross-talk in the chip's wires, and electrical interference and can lead to bits being flipped or lost during operation. The present technique considers a categorisation of flops. In particular, each flop within the circuit, which stores a bit, can be considered to be vulnerable, isolated, or conditionally vulnerable. A flop that is vulnerable is able to cause a malfunction in the circuit as a consequence of a transient error occurring. A flop that is isolated would not be expected to cause a malfunction as a consequence of a transient error occurring. Meanwhile, a conditionally vulnerable flop would be expected to cause a malfunction if another condition was met when a transient error occurred. This recognises the fact that data held within some flops might only be usable in certain circumstances, and thus, if not usable, an error that occurs to that data might be considered to be of little or no significance. Note that there is no requirement for the circuit to be physically present. In some embodiments, a design of the circuit is provided and it is this design that is analysed, potentially via emulation or simulation. The present technique does not rely on fault injection. That is, the present technique does not rely on every single sequential and combinatorial input being provided to each element in the circuitry in order to analyse its behaviour with such inputs, which could be computationally intractable for complex circuits. However, the above technique does consider the relationship between flops and also the extent to which particular flops are used in the execution of particular software. Consequently, the inter-relationships between the flops and the extent to which flops rely upon each other can still be considered.

In some embodiments, the apparatus comprises adjustment circuitry to perform re-categorisation, in response to at least one requirement, of an initially conditionally vulnerable flop in the flops to isolated and to cause the set of flops that are currently vulnerable to be re-determined. In such embodiments, it may be possible to cause a flop's categorisation to be changed, for instance by deciding to not use a flop that was categorised as conditionally vulnerable. Such a flop could therefore be considered to be isolated. This in turn can lead to a different estimate regarding the vulnerability of the circuit.

In some embodiments, the adjustment circuitry is to perform the re-categorisation by disabling a module of the processing circuitry and re-determining the set of flops that are currently vulnerable for the at least one cycle with the module disabled; and the module comprises the conditionally vulnerable flop. One way in which to achieve re-categorisation of a flop is by disabling a module of the circuitry containing that flop. With the module disabled, the flop effectively becomes isolated since it can no longer be used. As described above, this can therefore cause the vulnerability assessment of other flops, as well as the entire circuit, to change.

In some embodiments, the module is micro-architectural. Micro-architectural modules or features are those elements that are not required for the correct operation of the underlying circuit, but which provide optimisations over its running. An example of a micro-architectural feature is a prefetcher, which predicts when data is likely to be required and fetches that data from memory ahead of being explicitly requested/required. Such a module is not required for the circuit to operate correctly. Instead, it provides an optimisation—the effective latency of memory fetching is reduced by causing data to be fetched from memory before it is explicitly required so that it can be made available when that data is explicitly required. Although micro-architectural features can provide optimisations, they typically provide a scope for transient errors due to the presence of flops. Hence, if such micro-architectural features provide limited benefit, then they could be disabled in order to improve the overall reliability of the circuit. The measurement of reliability of the circuit could also be more consistent due to there being less scope for variation in execution (e.g. as a result of certain modules being used or not used in different executions).

In some embodiments, the module is storage circuitry. As with micro-architectural features, if the processing circuitry can operate without the presence of certain storage circuits, then it may be possible to increase the reliability of the processing circuitry. It may also be possible to reduce the variance in reliability due to there being less scope for different numbers of flops to be used during execution.

In some embodiments, the categorisation obtaining circuitry is adapted to obtain, for each conditionally vulnerable flop in the flops, a corresponding flop or signal that indicates whether that conditionally vulnerable flop contains valid data. In these situations, a conditionally vulnerable flop could be considered to be vulnerable if it contains valid data, and otherwise the flop could be considered to not be vulnerable. This recognises the fact that if data is not considered to be valid then the data held within that flop should not be used and thus if the data is changed, this should not lead to a malfunction. The corresponding flop can be determined using circuitry emulation or formal analysis tools such as "Jasper". In particular, if a first flop or signal always has a predetermined value (0 or 1) when a second flop is changed, then the first flop or signal can be considered to be a validity indicator for the second flop. Flops or signals containing words such as "valid" or "allowed" may also be indicative of flops or signals that indicate validity and such a search could also be carried out on or limited to such flops or signals. The signal could, for instance, be provided by an input wire to a processor core.

In some embodiments, the categorisation obtaining circuitry is adapted to obtain a lookup table that indicates, for each conditionally vulnerable flop in the flops, the corresponding flop or signal that indicates whether that conditionally vulnerable flop contains valid data. By using a lookup table, it is possible to quickly determine whether a conditionally vulnerable flop is currently vulnerable or not—by cross referencing its identity in the lookup table, determining the corresponding flop or signal that indicates whether it is vulnerable or not, and determining the current value of the corresponding flop or signal.

In some embodiments, the analysis circuitry is adapted to determine a number of the flops that are currently vulnerable.

In some embodiments, the analysis circuitry is adapted to determine that a given flop is currently vulnerable when: the given flop is categorised as vulnerable in the vulnerability categorisation, or the given flop is categorised as conditionally vulnerable and the corresponding flop or signal indicates that the given flop contains valid data. A flop is therefore currently vulnerable if it is categorised as vulnerable. The 'vulnerable' categorisation can, in some of these embodiments, be interpreted to mean 'unconditionally vulnerable'. A flop that has been marked as conditionally vulnerable can also be currently vulnerable if the corresponding flop or signal (that indicates validity) indicates that the flop is valid. A conditionally vulnerable flop could therefore change vulnerability over a period of time as data stored in that flop changes between being valid and invalid.

In some embodiments, the adjustment circuitry is adapted to cause the set of flops that are currently vulnerable to be re-determined by the analysis circuitry after the re-categorisation has occurred.

In some embodiments, the analysis circuitry is adapted to determine that a given flop is currently vulnerable if: the given flop is categorised as vulnerable in the vulnerability categorisation, or the given flop is categorised as conditionally vulnerable and the corresponding validity flop or signal indicates that the given flop contains valid data, otherwise the given flop is not currently vulnerable. Thus, if the flop is not categorised as vulnerable or conditionally vulnerable, it is considered to be isolated.

In some embodiments, the apparatus comprises calculation circuitry to calculate an instantaneous failure probability of the circuit, using the number of the flops that are currently vulnerable and a total number of the flops. The instantaneous failure probability therefore indicates, at a particular processor cycle, the proportion of the flops that are vulnerable.

In some embodiments, the apparatus comprises aggregation circuitry to produce an aggregate of the instantaneous failure probability of the circuit across a plurality of cycles of the processing circuitry. The aggregation takes a number of instantaneous failure probabilities (each associated with a different cycle of the processor) and combines these values together. The aggregate could, for example, be a sum or an average (e.g. in the form of a median, mean, or mode). Other forms of aggregation will be known to the skilled person. By performing aggregation, it is possible to provide an idea of the instantaneous failure probability over a number of cycles of the processor.

In some embodiments, the apparatus comprises circuit receiving circuitry to receive a representation of the circuit; and simulation circuitry to provide, using the representation of the circuit, an instruction environment corresponding to the processing circuitry of the circuit and to simulate the one cycle of the processing circuitry, wherein the analysis circuitry determines the set of the flops that are currently vulnerable, using the representation of the circuit. In these embodiments, a representation of the circuit is provided. This could be in the form of a file that describes the layout of the components of the circuitry. For instance, the representation could be received in Register Transfer Level (RTL) format. Based on this representation, the circuitry for which analysis is to be performed is simulated so that one cycle of the processor that makes up the circuit being represented can be analysed in order to determine the flops that are currently vulnerable during that cycle of the processor.

In some embodiments, the circuit is adapted to execute an application for a plurality of cycles of the processing circuitry; and the analysis circuitry is adapted to determine, for each of at least some of the flops, a number of the plurality of cycles for which that flop is vulnerable during execution of the application by the processing circuitry, based on the vulnerability categorisation of the flops. By determining the number of cycles for which a flop is vulnerable during execution of the application, it is possible to analyse the potential of a flop to causing a malfunction. If, for instance, a flop is vulnerable for a large number of cycles of the processor circuitry, then that flop has a higher potential to cause a malfunction than a flop that is vulnerable for a shorter period of time.

In some embodiments, the analysis circuitry is adapted to determine, for each of at least some of the flops, a failure probability of one of the flops by determining a ratio of the number of the plurality of cycles for which the one of the flops is vulnerable to the number of the plurality of cycles, during execution of the application by the processing circuitry. The failure probability provides a context to represent the extent to which a flop has the potential to cause a malfunction in a processing circuit. By considering both the number of processor cycle for which a flop is considered to be vulnerable together with the number of processor cycles used for execution of the application, it can be determined the proportion of the application's runtime for which the flop is considered to be vulnerable. Clearly if a flop is only vulnerable for one processor cycle then this is a low level of vulnerability (e.g. a lower probability of failure) if the application executes for 100 processor cycles. However, it is a much higher level of vulnerability (e.g. a higher probability of failure) if the application requires only 20 processor cycles to execute.

In some embodiments, the at least one requirement comprises a requirement that the failure probability of the conditionally vulnerable flop is below a threshold. For instance, such a threshold could be 10% or 15% of all clock cycles in which the processing circuitry operates. Alternatively, the usage could be considered over a number of executions of the processing circuitry, either as an average or a total. For instance, the threshold could be 5% of all processing circuitry cycles when considered over 10 executions of the processing circuitry. In some embodiments, the usage is measured as a maximum number of processor cycles of use across each a number of executions. In some embodiments, the usage could be measured as a difference between a maximum usage and a minimum usage across a total number of executions. For instance if, in 10 executions of the processing circuitry, a module was used for a minimum of 5% of the time (in one execution) and a maximum of 28% of the time (in another execution) then the difference would be 23%. The threshold might also consider a combination of these factors. For instance, the threshold might require an average usage of 10% with a difference of 50%. The threshold might be presented as a relationship between two factors. When the threshold is reached, the categorisation could be re-performed with the module/flops whose usage fell below the threshold disabled becoming 'isolated'. In disabling such flops, the reliability of the processing circuitry could increase (due to fewer flops being used) and the variance in reliability could also be reduced (due to there being less scope for different numbers of flops to be used during execution). Such isolation could be achieved, for instance, by disabling the module comprising those flops, or by disabling the flops themselves.

In some embodiments, the apparatus comprises aggregation circuitry to produce an aggregate of the failure probability of the one of the flops across the plurality of flops. This aggregation circuitry can therefore take a number of failure probabilities of different flops and aggregate these failure probabilities to provide a failure probability for all or part of a circuit. This data therefore provides an indication of the susceptibility of all or part of a circuit to malfunction.

In some embodiments, the analysis circuitry is adapted to determine a failure mode distribution of an output port of the circuit based on the failure probability of contributing flops of the output port during execution of the application by the processing circuitry; and failure mode distribution of the output port is based on the sum of the failure probability of the contributing flops of the output port and a total of the contributing flops for each output port in the circuit. In a processing circuit, the output from one flop might be provided as an input to another flop. For instance, the flops that make up a register could be output bits to a series of flops that perform addition. In this way, the result of the addition is dependent on the bits that are passed in. Consequently, the probability of a malfunction occurring on the flops that perform addition is dependent not only on the probability of malfunction by the flops that perform addition, but also on the probability of malfunction by the flops that make up the register that outputs data. If an error occurs with either of these, a malfunction could occur. In these embodiments, the flops that make up the register are said to be 'contributing' flops. The failure mode distribution of an output port considers the failure rate of the flops that contribute data that output port.

There are a number of ways in which the contributing flops can be determined. However, in some embodiments, the contributing flops comprise those flops for which a changed value has potential to cause a change in an output at the output port. This supports the above situation in which an error that occurs with respect to one flop can cause erroneous data to be output at an output port.

Another way of determining the contributing flops, used in some embodiments, is that the contributing flops comprise those flops that at least indirectly provide data to the output port. For example, if the value '0' stored in a flop was flipped to a '1', then this would represent not only a malfunction of the flop, but it would also potentially cause incorrect behaviour along the route to an output port.

In some embodiments, the failure mode distribution of the output port is based on the sum of the failure probability of the contributing flops of the output port and a total of the contributing flops for each output port the circuit. An overall failure mode distribution for the circuitry can be considered to relate to the probability with which any final result produced by output ports of that circuitry might be erroneous.

In some embodiments, the apparatus is a hardware monitor; and the analysis circuitry is adapted to access the flops of the circuit during the one cycle. A hardware monitor can be provided to determine, live, the vulnerability of a processing circuitry to failure, e.g. the current safeness of the circuit. Having categorised the flops, this can be achieved by accessing the flops and determining the extent to which they are currently vulnerable based on their classification.

Particular embodiments will now be described with reference to the figures.

FIG. 1 illustrates a flow chart 100 that shows a process of determining the vulnerability or the safeness of a circuit using simulation. At a step 110, the Register Transfer Level (RTL) simulation is begun. Independently of this, at a step 120, a classification of the flops in the circuitry takes place. This classification may also take place using the RTL representation. Each of the flops is classified (using, for instance, formal methods) into one of three categories.

The first category is the 'vulnerable' category in which the flop is vulnerable to errors regardless of the state of other flops in the circuitry. An example of a flop that falls into the first category could be a flop that implements a program counter. In this example, the program counter is always vulnerable and its vulnerability does not depend on the value of another flop in the circuitry.

The second category is 'conditionally vulnerable' in which the flop is vulnerable in dependence on the value of another flop or signal. For instance, a particular flop may only be vulnerable while the data within that flop is considered to be valid, since the circuitry may be prohibited or inhibited from using the data in that flop while it is marked as being invalid. Thus, while invalid no error can be propagated. An example of a flop that falls into the second category could be the value of a data item stored within a register file or store buffer. Since the data value in a register file will not be used when it is marked as being invalid, the vulnerability of such a flop to an error is dependent on the validity marker. That is, while the validity marker indicates that the flop that provides the data value is valid, it is prone to causing an error. In contrast, when the value is marked as being invalid, the data value is not used and so no data can be propagated.

The third category is 'isolated' in which the value of the flop is irrelevant to the operation of the circuitry. An example of a flop that falls within the third category could be a debug flag that is not used within a standard operating environment.

Figure 2:
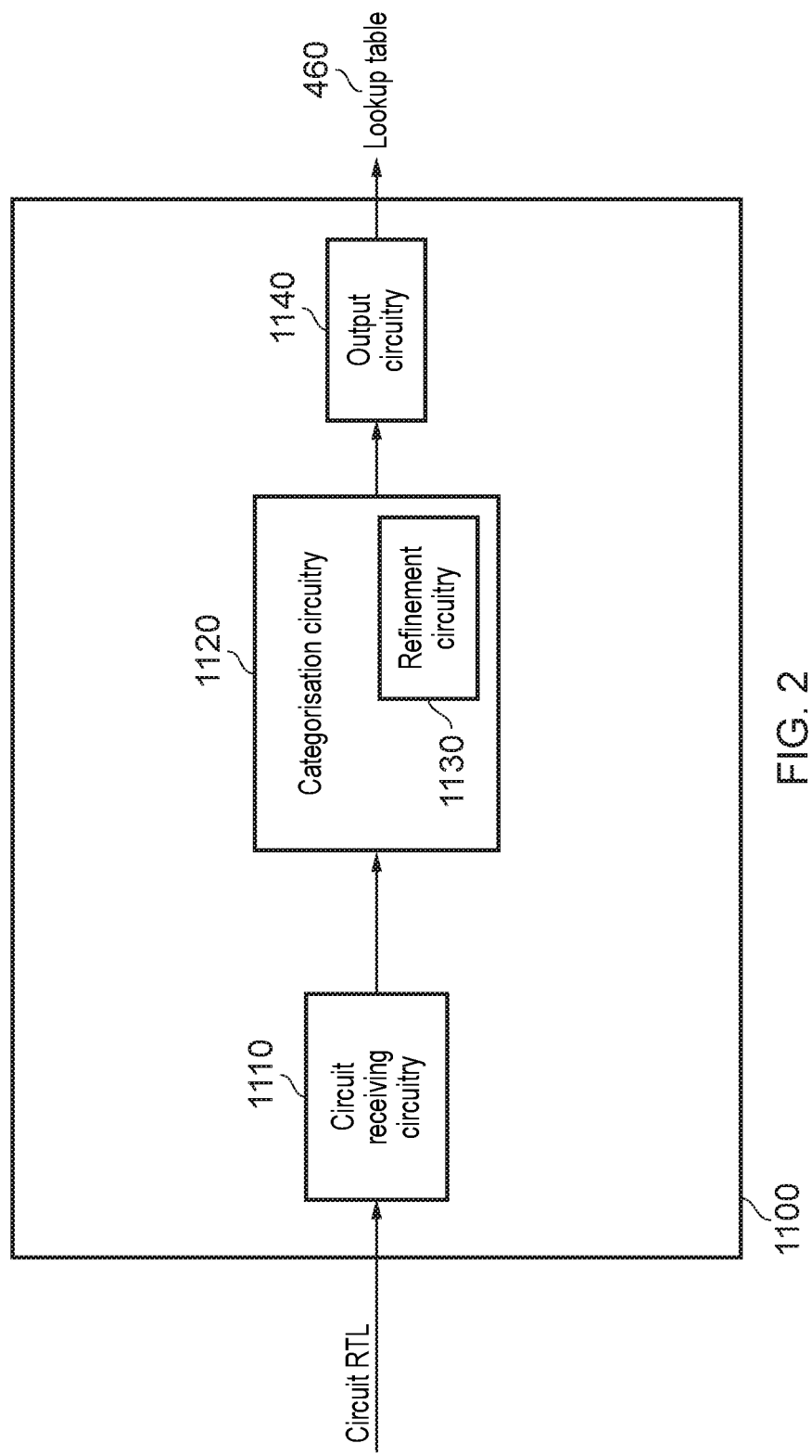
FIG. 2 illustrates an apparatus in accordance with some embodiments.

The process of performing the classification is illustrated with respect to FIG. 2. This can be achieved through the use of formal methods or by SAT solving techniques. An apparatus for performing the classification is illustrated with respect to FIG. 5. Having performed this classification, a refinement of the classification may optionally take place at step 125, techniques for performing refinement are illustrated with respect to FIG. 4A and FIG. 4B. From the classification, a lookup table is created at step 130. The lookup table creates cross-referencing between a flop, its (refined) categorisation, the identity of any flag that indicates the validity of the flop (in the case of the 'conditionally vulnerable' classification), and a data bit size that indicates the number of bits stored by or in association with that flop. Step 140 begins a loop that recurs for every cycle of the simulated circuitry. At a step 150, a number of the currently vulnerable flops is determined using the lookup table that was created at step 130. In particular, any flops that fall into the first category of 'vulnerable' are considered to be currently vulnerable. Additionally, for any flops that are considered to be 'conditionally vulnerable', the corresponding validity flag is accessed in order to determine whether the data is valid (and therefore vulnerable) or not. Other flops that fall into the 'isolated' category are not currently vulnerable. This information can then be used in step 160 in order to determine an instantaneous failure probability ($F_{Inst}$), which is determined as the number of currently vulnerable flops in the circuitry ($\mu vul_{Inst}$) divided by the number of flops in the circuitry ($T_{nf}$).

This process can be repeated for each cycle, by returning to step 140. Accordingly, an instantaneous failure probability is determined for each cycle. When the simulation is complete, then at step 170 it is possible to take each of the instantaneous failure probabilities that were generated in order to aggregate them. The aggregation could take the form of an average such as a mean, mode or median and an overall instantaneous failure probability can then be determined for the behaviour of the circuit while executing the application under simulation.

FIG. 2 illustrates an apparatus 1100 for performing the categorisation in accordance with some embodiments. The apparatus receives a circuit representation in the form of an RTL file. The circuit that is represented using RTL is assumed to have had redundant parts of the circuit removed. The RTL representation is received by circuit receiving circuitry 1110, which provides data to the categorisation circuitry. Categorisation circuitry 1120 produces an initial categorisation of the flops in the circuit represented by the circuit RTL. This categorisation can be produced using, for instance, formal methods or SAT solving, both of which are described below.

This initial categorisation is refined using refinement circuitry 1130, which may use, for instance SEC (also discussed below) in order to further refine the initial categorisation. Data from the categorisation process is passed to output circuitry 1140, which produces the lookup table.

Figure 3:
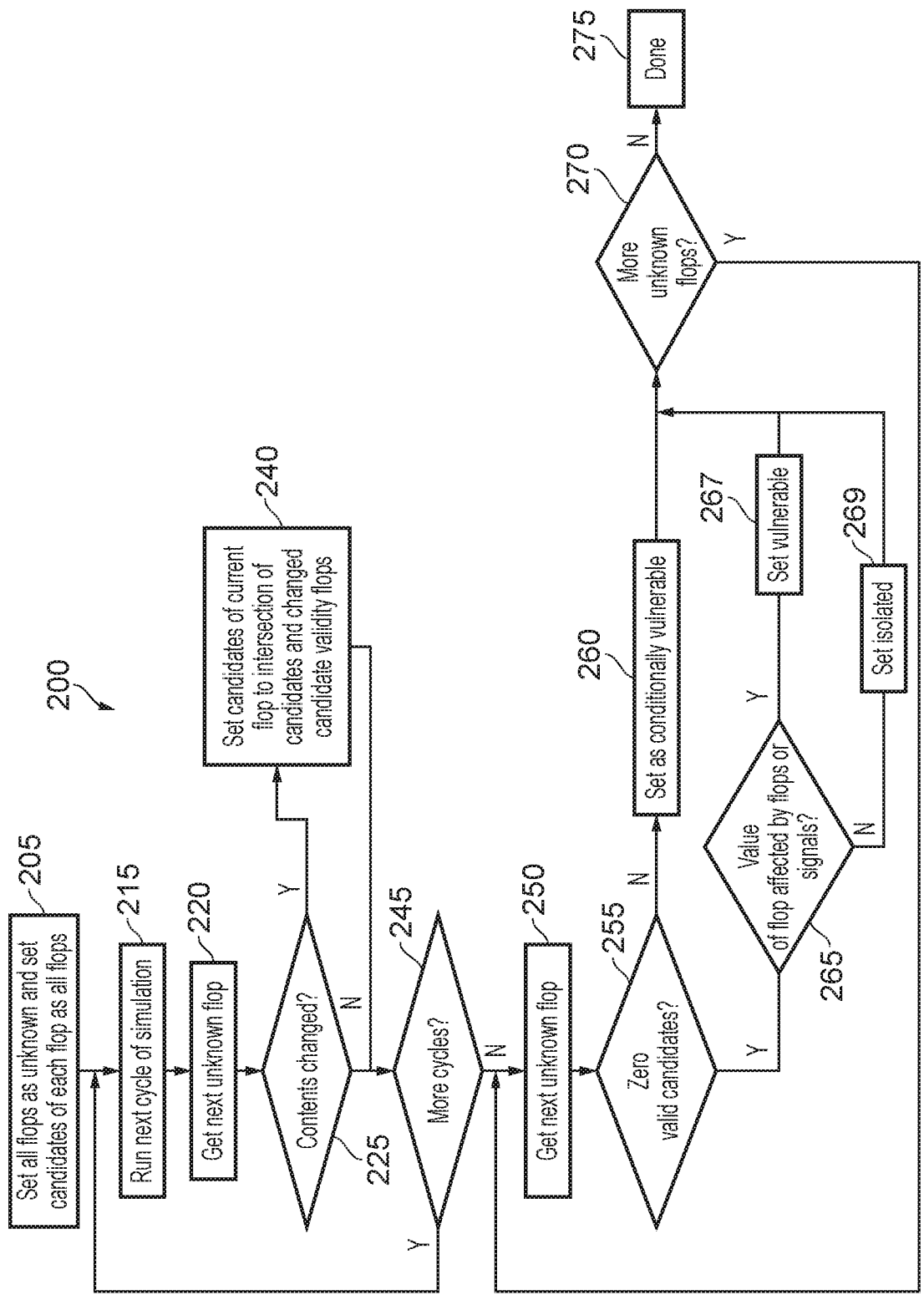
FIG. 3 illustrates, in the form of a flow chart, a process for classifying the flops of a circuit that is being analysed in accordance with some embodiments.

FIG. 3 illustrates, in the form of a flow chart 200, a process for classifying the flops of a circuit that is being analysed. This process assumes that redundant parts of the circuit have already been removed. In particular, this process assumes that all the output of each flop is 'consumed' in the representation of the circuit being tested. At a step 205, all of the flops in the circuitry are classified as 'unknown'. Each flop also maintains a set of candidate corresponding validity flops. These are initialised to the set of all flops in step 205, for all flops. The validity candidates for each flop represent the possible candidates for the validity indicator for that flop if the flop turns out to be conditionally vulnerable.

At step 215, a next cycle (or first cycle) of the simulation is performed. At a step 220, the next (or first) flop that is still classified as being 'unknown' is obtained. At a step 225, it is determined whether the contents of that flop have changed since the previous cycle of the simulation. If not, then the process proceeds to step 245. If so, then the set of validity candidates for the current flop are set to the intersection of the current set of candidates and the validity flops that have changed in the most recent cycle of the simulation. Consequently, flops can only be removed from the list of validity candidates if they do not change when the flop's contents change. The process then proceeds to step 245. Over the course of the simulation, this tracks the flops that could indicate a change in value of each flop.

In practice, this tests the formal hypothesis:

(##1 $changed(payload))|→(flag==1)

Which is to say that there exists some flag (the validity flop) that changes in response to the payload of a flop changing. If, in running the simulation, it transpires that there is no such flag that changes every time the payload of a flop changes, then there is no validity indicator for that flop, and so the flop is either isolated or vulnerable. If there is such a flag, then the flag can reasonably be said to be a validity indicator for the flop.

At step 245, it is determined whether there are more cycles of the simulation to be executed. If so, then the process proceeds back to step 215 where the next cycle of the simulation is executed. If not, then at step 250 a new loop begins, which considers each of the remaining 'unknown' flops. At step 255, it is determined whether there are zero valid candidates for the current unknown flop. If not, then at step 260, the flop is marked as being 'conditionally vulnerable' (e.g. conditional on the candidates). Otherwise, at step 265, it is determined whether a value of the flop is affected by other flops or signals in the circuit. This can be determined based on the structure of the circuit (e.g. by analysing inputs and outputs) for example. If it is affected in this manner, then at step 267, the flop is marked as being 'vulnerable' since it is affected by at least one other flop or signal, but is not conditionally vulnerable. If it is not affected in this manner, then at step 269, the flop is marked as being 'isolated'. In either event, the process then proceeds to step 270 where it is determined whether there are more 'unknown' flops to be considered. If so, then the process returns to step 250. If not, then the process proceeds to step 275 where the process ends.

The differentiation between isolated and vulnerable flops can also be achieved using formal methods. For instance, firstly, the circuit can be considered in a scenario in which unused features are disabled. For example, any debug mode could be disabled. Secondly, the following formal hypothesis can be applied across the design:

1|→$stable(payload)

This checks for flops that are unaffected by any other flop or signal in the circuit. Such flops are considered to be 'isolated'. Flops for which the property does not hold (e.g. flops that are affected by other flops or signals in the circuit) are classified as 'vulnerable'.

In this embodiment, all flops in the circuit are considered as possible validity candidates for all of the flops (e.g. in step 205). However, in other embodiments, an analysis of the names of the flops could be used to refine this list. For example, in some embodiments, the initial list of candidates in step 205 is set to all flops whose names, in the RTL representation contain words such as "valid", "enable", "indicate", or other synonyms thereof. Similarly, flops that are considered to be isolated may be established or limited based on names. For instance, such flops may be required to contain words such as "unused" or "debug".

It will be appreciated that, for any of the categories, classification could take place based on data that is provided by the designer. For instance, the designer could provide a set of flops that are known to be unused. In some embodiments, this could replace the classification that is performed, whereas in other embodiments, this information is used as part of the classification process (either to limit flops that can be so categorised, or as a starting point for determining the categories of other flops).

The above explanation indicates how formal methods can be used in order to establish the classification. It is also possible to use SAT solving techniques in order to perform the classification of flops.

Figure 4:
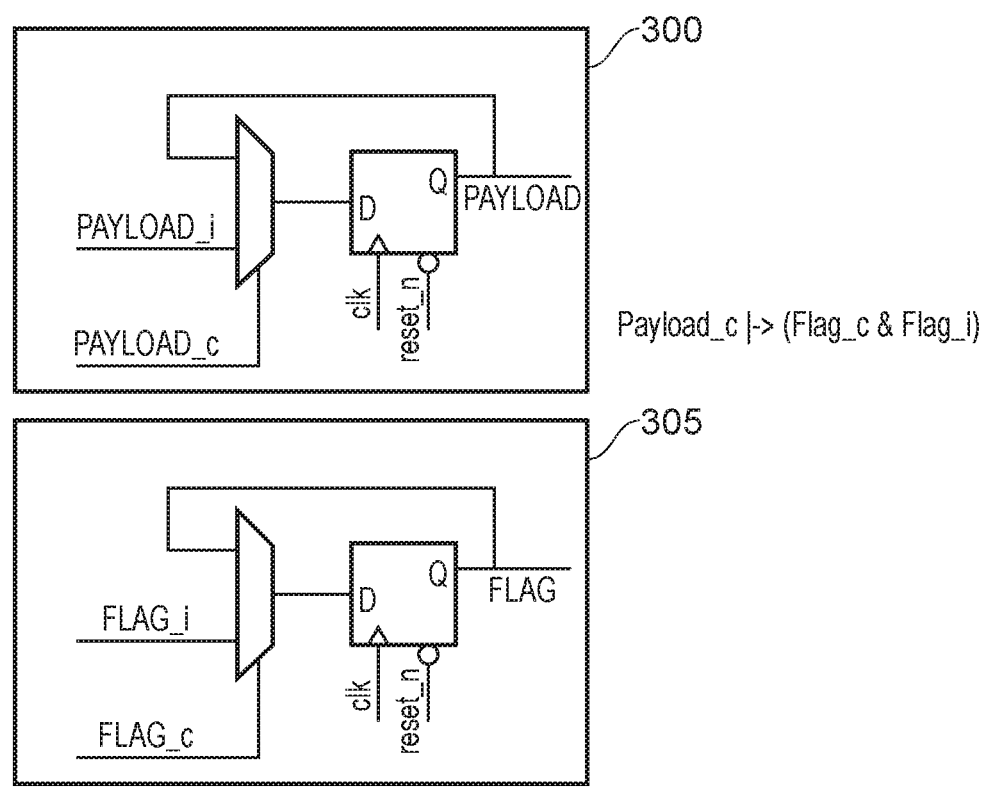
FIG. 4 schematically illustrates a hardware implementation of a flop together with its input and output signals.

FIG. 4 shows a hardware implementation of a flop 300 which can be driven to store a signal (PAYLOAD_i) in response to another signal (PAYLOAD_c) being asserted. Each of these values can be represented as a Boolean (true or false). A SAT solver can therefore be used to determine whether the input value to the flop 300 is dependent on one or more other flops 305 or the signals provided to those flops 305.

For instance, in the example of FIG. 4, a second (validity) flop 305 stores an indication of whether the data in the first flop 300 is valid. The inputs to the second flop 305 might be the validity indicator to be stored (FLAG_i) together with an indicator (FLAG_c) of whether the second flop 305 should store the validity indicator (FLAG_i).

A SAT solver can be used to determine whether the value PAYLOAD_c implies FLAG_c and FLAG_i. In other words, the SAT solver can be used to determine whether a change in the payload (i.e. PAYLOAD_c) affects the validity flop 305 (FLAG_c and FLAG_i).

Having performed the categorisation, a refinement can take place in order to better categorise some of the flops, in some circuits.

Figure 5B:
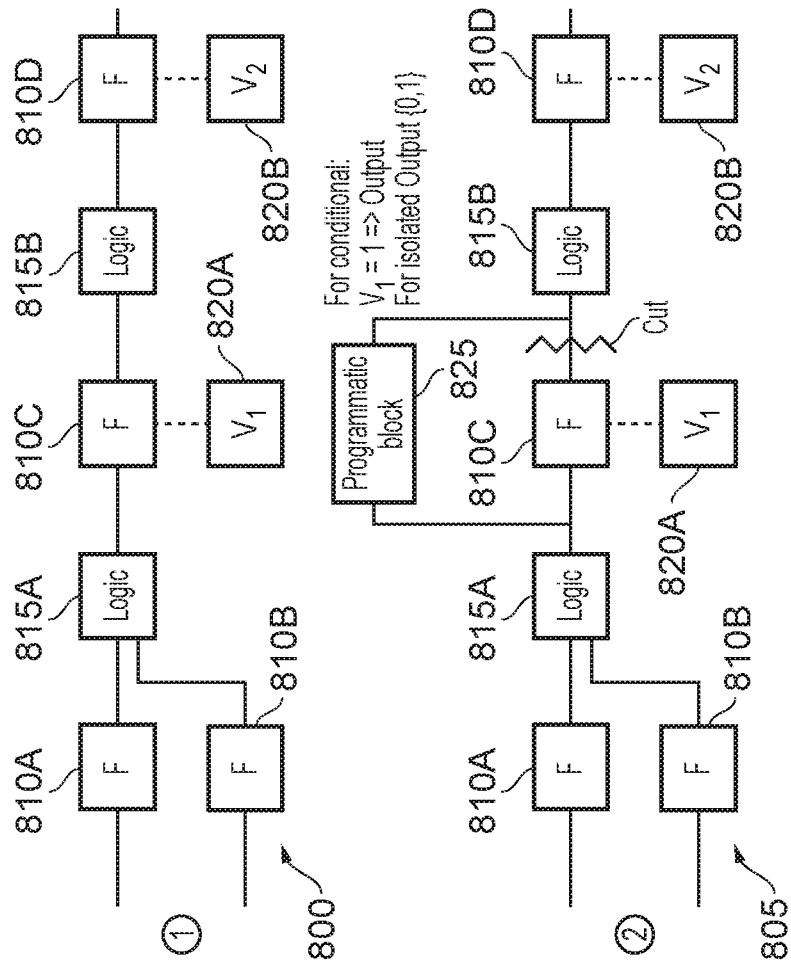
FIG. 5B schematically illustrates the use of Sequential Equivalence Checking for refining the categorisation.
Figure 5A:
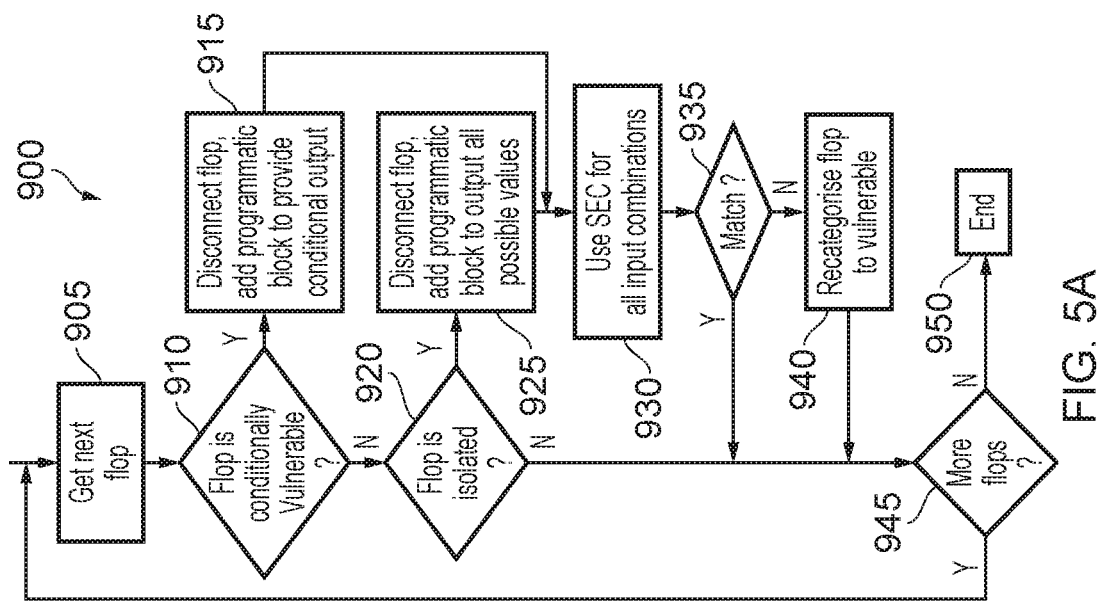
FIG. 5A illustrates, in the form of a flow chart, a process for performing refinement of the flop categorisation.

FIG. 5A illustrates a method in which the categorisation can be improved using SEC. The method is illustrated in the form of a flowchart 900. At a step 905, the next (or first) flop is considered. At a step 910, it is determined whether the flop is currently categorised as conditionally vulnerable. If so, then at step 915, a mutated circuit is formed by copying the circuit and disconnecting the flop. A programmatic block is then inserted (described in more detail below) in which output is conditionally provided. In particular, output of this programmatic block is provided if and only if the corresponding validity indicator for this conditionally vulnerably flop indicates validity. The process proceeds to step 930. If the flop is not categorised as conditionally vulnerable, then at step 920, it is determined if the flop is categorised as isolated. If so, then at step 925, a mutated circuit is formed by copying the circuit and disconnecting the flop. A different programmatic block is then inserted in which the each possible output is tested. The process again then proceeds to step 930. If the flop is not categorised as conditionally vulnerable or as isolated, then at step 920, the process proceeds to step 945.

At step 930, SEC is performed. This tests the equivalence of the circuit with the mutated circuit. SEC is performed for all combinations of inputs in the circuit, and in the case of an isolated flop, for each possible output provided by the programmatic block. At step 935 it is determined if, in each case, the outputs of the circuit and the mutated circuit match. If so, then no categorisation needs to take place and the process proceeds to step 945. Otherwise, at step 940, the flop is recategorised as vulnerable and the process proceeds to step 945.

At step 945, it is determined whether there are more flops. If so, then the process returns to step 905. Otherwise, at step 950, the process ends.

This method tests each flop that is either conditionally vulnerable or isolated to see if they are really conditionally vulnerable or isolated. This is tested by SEC. In the case of potentially conditionally vulnerable flops, the programmatic blocks acts as a genuinely conditionally vulnerable flop—e.g. by only providing an output when validity is indicated by the corresponding validity flop(s)/signal(s). If there is an equivalence between such a circuit and the original circuit, then it can be assumed that the flop is, in fact, conditionally vulnerable. In the case of isolated flops, the programmatic block outputs all possible values (this could be achieved by outputting a random output each time). If there is an equivalence between the circuit and the mutated circuit (regardless of the input to the circuit, or the output of the programmatic block) then the output of the programmatic block has no effect. In which case, the flop is, in fact, isolated.

If there is no equivalence then the flop is not isolated or not conditionally vulnerable as suspected. The flop is therefore 'promoted' to being vulnerable. This represents a pessimistic view of reliability. Rather than being sometimes vulnerable or never vulnerable, the flop is instead treated as being always vulnerable.

In terms of formal hypotheses, the assumption that is tested for in this process can be stated as follows:

assume "payload"=(Flag==1'b1)? $past(payload_c ?payload_i: payload):'hX;

Where the flag represents the corresponding validity indicator, payload_c again represents the signal that indicates that a new value is to be stored by the flop, payload_i represents the new value to be stored by the flop and the X represents 'any value' of 0 or 1.

FIG. 5B illustrates the insertion of the programmatic block In FIG. 5B, an initial ("golden") circuit 800 is presented, on which an initial categorisation has been performed. The circuit contains a number of flops 810, logic blocks 815, and validity flops 820. In the mutated circuit, the flop 810C is disconnected from its outputs and a programmatic block 825 is inserted, which instead provides the outputs. The inputs to the original flop 810C are provided to the programmatic block 825.

The programmatic block is such that, for a conditionally vulnerable flop, the input to the programmatic block 825 is output (e.g. to logic block 815B) in dependence on the validity flop 820A associated with the replaced flop 810C. If the validity flop 820A indicates validity (e.g. in this example, the validity flop 820A is '1') then the programmatic block 825 outputs whatever is input to it. This therefore mimics the behaviour of a conditional flop.

For an isolated flop, the programmatic block 825 outputs all possible outputs. For each possible output, the mutated circuit (in which that output is produced) is compared to the golden circuit. This is repeated for each possible input into the circuit. If there is equivalence for every output of the programmatic block 825, then the output of the flop 810C is irrelevant and the flop is therefore isolated.

The mutated circuit 805 is otherwise a copy of the initial circuit 800. If SEC determines that the two circuits remain equivalent (e.g. for any sequence of inputs, the output of both circuits 800, 805 is identical) then the flop 810C can be considered to be conditionally vulnerable or isolated as originally assumed. Otherwise, a miscategorisation has occurred and so the flop 810C is promoted to being vulnerable.

Figure 6:
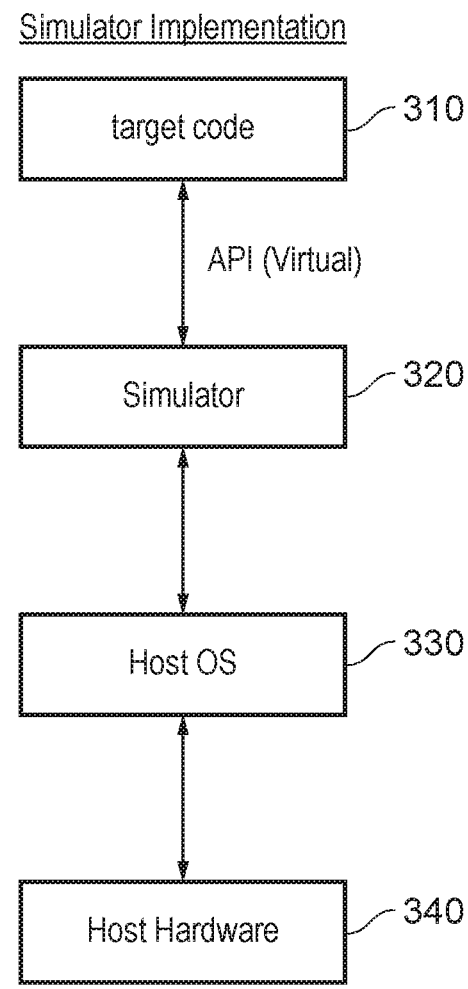
FIG. 6 illustrates a simulator implementation that may be used for simulating the circuit in order to perform the above-described categorisation of the flops in accordance with some embodiments.
Figure 7:
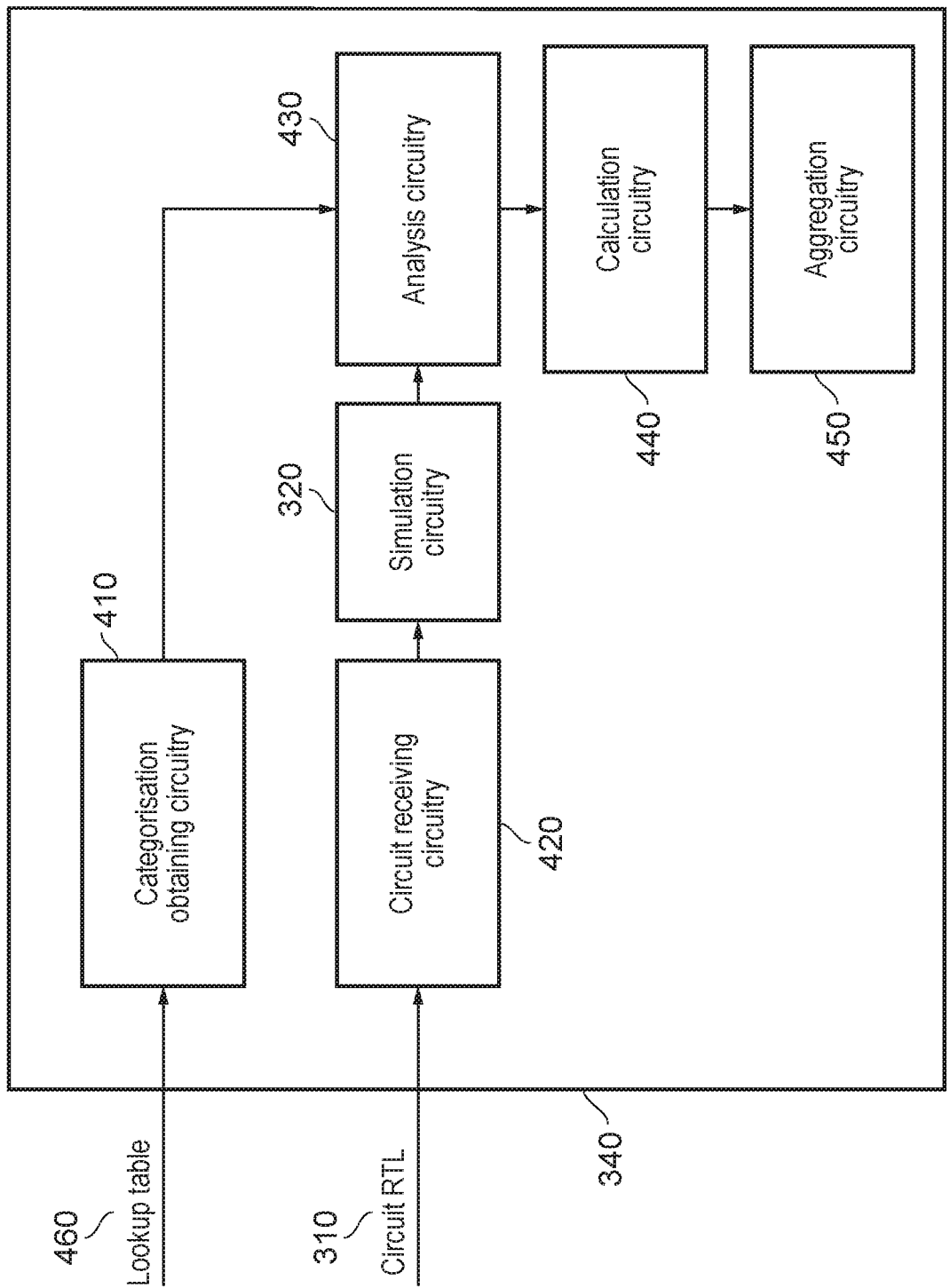
FIG. 7 illustrates an apparatus in the form of host hardware for performing a simulation analysis of the safeness of a circuit in accordance with some embodiments.

FIG. 6 illustrates a simulator implementation that may be used either for providing the behaviour of the categorisation circuitry 1120 in simulating the circuit's behaviour in step 215 of FIG. 2 when categorising the flops, or for analysing the safety or the reliability of the circuit using the categorisation (as described with respect to FIG. 7, for example).

Whilst some embodiments implement the present invention in terms of apparatus and methods for operating specific processing hardware supporting the techniques concerned, it is also possible to provide an instruction execution environment in accordance with the embodiments described herein which is implemented through the use of a computer program. Such computer programs are often referred to as simulators, insofar as they provide a software based implementation of a hardware architecture. Varieties of simulator computer programs include emulators, virtual machines, models, and binary translators, including dynamic binary translators. Typically, a simulator implementation may run on a host processor 340, optionally running a host operating system 330, supporting the simulator program 320. In some arrangements, there may be multiple layers of simulation between the hardware and the provided instruction execution environment, and/or multiple distinct instruction execution environments provided on the same host processor. Historically, powerful processors have been required to provide simulator implementations which execute at a reasonable speed, but such an approach may be justified in certain circumstances, such as when there is a desire to run code native to another processor for compatibility or re-use reasons. For example, the simulator implementation may provide an instruction execution environment with additional functionality which is not supported by the host processor hardware, or provide an instruction execution environment typically associated with a different hardware architecture. An overview of simulation is given in "Some Efficient Architecture Simulation Techniques", Robert Bedichek, Winter 1990 USENIX Conference, Pages 53-63.

To the extent that embodiments are described with reference to particular hardware constructs or features, in a simulated embodiment, equivalent functionality may be provided by suitable software constructs or features. For example, particular circuitry may be implemented in a simulated embodiment as computer program logic. Similarly, memory hardware, such as a register or cache, may be implemented in a simulated embodiment as a software data structure. In arrangements where one or more of the hardware elements referenced in the previously described embodiments are present on the host hardware (for example, host processor 340), some simulated embodiments may make use of the host hardware, where suitable.

The simulator program 320 may be stored on a computer-readable storage medium (which may be a non-transitory medium), and provides a program interface (instruction execution environment) to the target code 310 (which may include applications, operating systems, a hypervisor, and/or circuitry) which is the same as the application program interface of the hardware architecture being modelled by the simulator program 320. Thus, the program instructions of the target code 310, including a description of the circuitry that is to be analysed, together with an application that the circuitry is to execute, may be executed from within the instruction execution environment using the simulator program 320, so that a host computer 340 which does not actually have the hardware features of the apparatus discussed below can emulate these features.

FIG. 7 illustrates an apparatus 340 in the form of host hardware for performing a simulation analysis of the safeness or reliability of a circuit represented as a circuit RTL. The apparatus 340 receives a lookup table 460 using categorisation obtaining circuitry 410. The lookup table 460 includes the categorisation of the flops within the circuitry 310, together with any corresponding validity flop, and the number of bits represented and may be produced using the apparatus illustrated with respect to FIG. 2 and the methods described with reference to FIGS. 3, 4, and/or 5.

The categorisation is passed to analysis circuitry 430. The apparatus 340 also includes circuit receiving circuitry 420 that receives the representation of the circuit 310. This is passed to simulation circuitry 320 that simulates the behaviour of the circuit RTL. The simulation circuitry 320 could take the form, for instance, of a general purpose processor that uses software in order to implement a simulator. Alternatively, the simulator could be implemented as dedicated hardware. The analysis circuitry 430 uses the results of simulation of the circuit RTL 320 and the lookup table 460 in order to determine the vulnerability of the flops during execution of an application by the circuit. This information is passed to the calculation circuitry 440 that is able to determine a number of metrics including an instantaneous failure probability of the circuitry. This can be calculated on a per-cycle basis. Aggregation circuitry 450 is provided in order to aggregate the instantaneous failure probabilities across a plurality of cycles using, for instance, an average.

In the above description, it is demonstrated how the safeness or the vulnerability of a circuit can be tested under simulation using a representation or descriptor of the circuit together with analysis of that descriptor in order to provide a categorisation of the flops within that circuit. However, it is also possible to perform analysis of a circuit live by using the categorisation.

Figure 8:
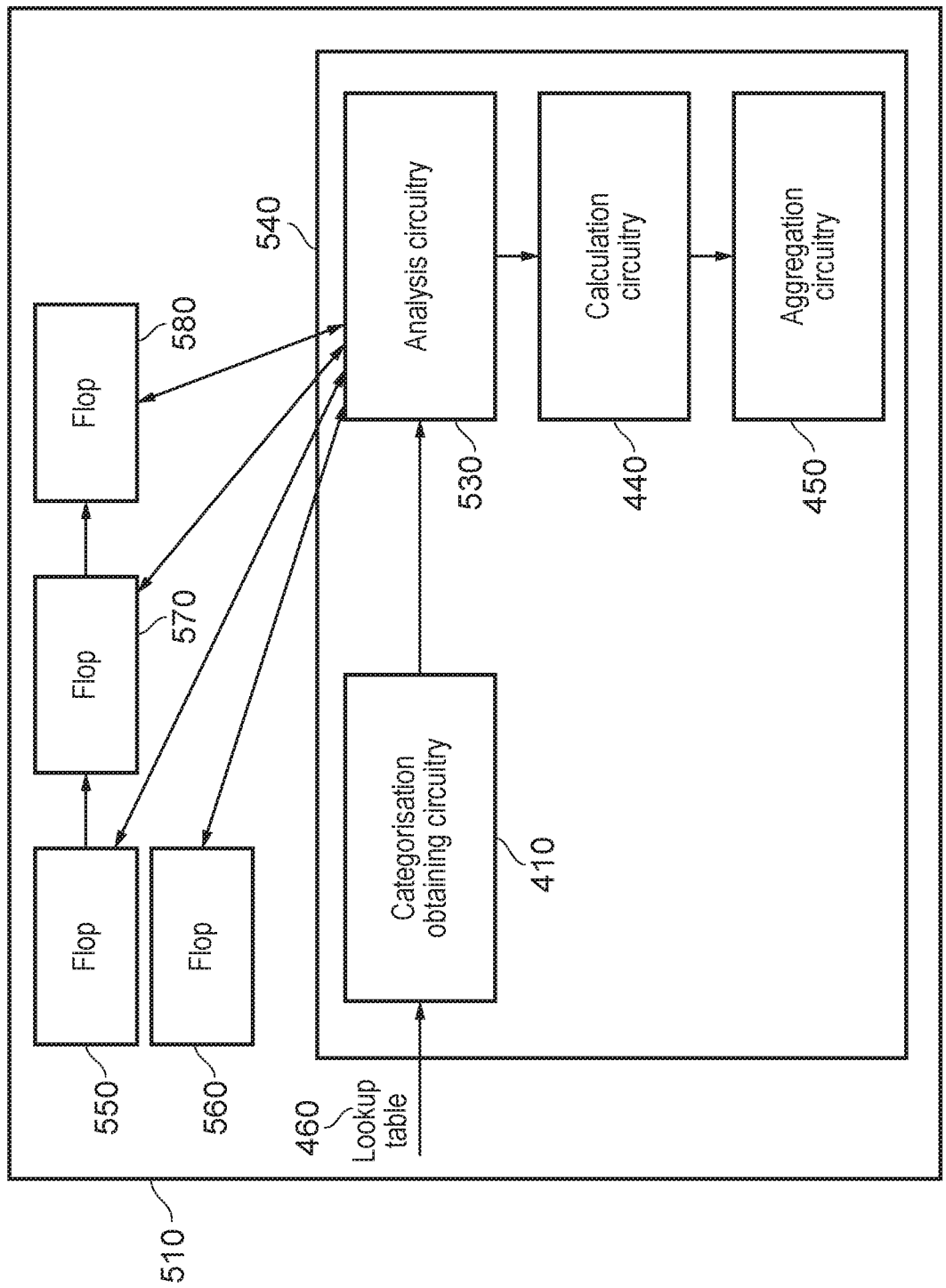
FIG. 8 illustrates a circuit that uses vulnerability determination circuitry in order to determine a vulnerability of the circuit in accordance with some embodiments.

FIG. 8 illustrates a circuit 510 that uses vulnerability determination circuitry 540 in order to determine a vulnerability of the circuit 510. In this embodiment, it is not necessary for simulation of the circuitry 510 to take place, since a live analysis of the flops 550, 560, 570, 580 themselves that are within the circuit 510 can take place. In this embodiment, the vulnerability determination circuitry 540 includes categorisation obtaining circuitry 410 that receives a lookup table 460 as previously discussed. From here, the lookup table 460 is passed to analysis circuitry 530. In this embodiment, rather than basing the analysis on the results of simulation, the analysis circuitry 530 queries each of the flops 550, 560, 570, 580 in order to determine whether those flops that are marked as being conditionally vulnerable by the lookup table 460 are currently vulnerable. To this list, the set of flops that are categorised as vulnerable is added, and this information is passed to the calculation circuitry 440 in order to determine an instantaneous failure probability. This operation can be performed each cycle and the results can be passed to the aggregation circuitry 450 in order to produce an aggregate vulnerability calculation as previously discussed.

Using the previously described techniques, it is possible to perform analysis on the safeness of a circuit with flops that may be vulnerable, isolated, or conditionally vulnerable. Such analysis can be a better representation of the safeness of the circuit when executing a particular application than previously proposed techniques since it provides a more fine-grained analysis when particular flops in the circuitry are vulnerable.

We now discuss how the behaviour of a program executed by circuitry (simulated or real) can be analysed by using the flop categorisation.

Figures 9A, 9B:
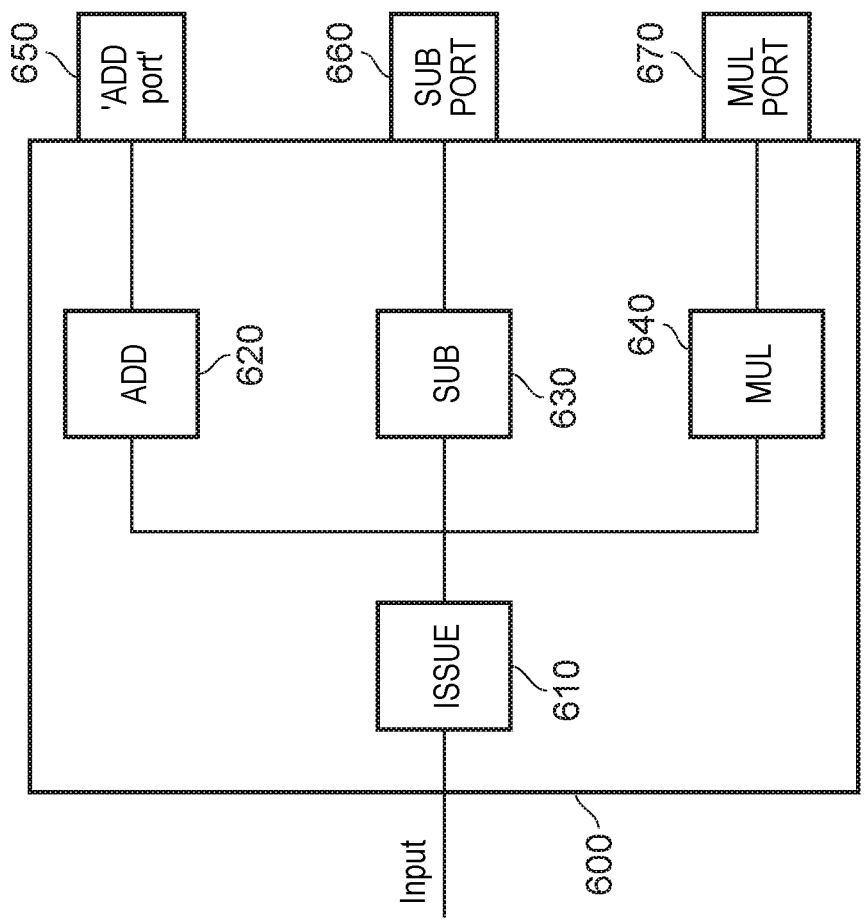
FIG. 9A shows an example program comprising four instructions in accordance with some embodiments.
FIG. 9B illustrates a circuitry for executing the program illustrated with respect of FIG. 9A in accordance with some embodiments.

FIG. 9A shows an example program comprising four instructions. The first instruction is an add instruction, the second instruction and third instruction are multiply instructions, and the fourth instruction is a subtract instruction. A dummy no-operation instruction is provided as the fifth instruction, which may be issued but which has no effect.

FIG. 9B illustrates a circuitry 600 for executing the program illustrated with respect of FIG. 9A, whose safeness is to be analysed. In particular, an input is received by the circuitry 600 in the form of one of the instructions. These are provided to an issuing flop 610 that issues the instruction to one of: an addition flop 620 in the case of the addition instruction, a subtraction flop 630 in the case of a subtraction instruction, and a multiplication flop 640 in the case of the multiplication instructions. From here, each of the flops performs an operation and produces an output that is provided to one of three output ports 650, 660, 670 for the circuitry 600. In particular, the addition flop 620 produces an output to an addition output port 650, the subtraction flop 630 produces an output that is passed to a subtraction output port 660, and the multiplication flops 640 produces an output that is passed to a multiplication output port 670.

Figure 10:
FIG. 10 illustrates an example block execution table in accordance with some embodiments.

FIG. 10 illustrates a block execution table that shows the execution of the program illustrated with respect of FIG. 9A on the circuitry 600 illustrated with respect to FIG. 9B. The execution takes place over five clock cycles.

In a first cycle, the first addition instruction is passed to the issue flop 610.

In a second clock cycle, the addition instruction is passed from the issue flop 610 to the addition flop 620. At the same time, the multiplication instruction is passed to the issue flop 610.

In a third cycle, the addition instruction at the addition flop 620 is completed and passed to the addition output port 650. The first multiplication instruction is passed from the issue flop 610 to the multiplication flop 640. A second multiplication instruction is then received by the issue flop 610.

In a fourth clock cycle, the second multiplication instruction is completed by the multiplication flop 640, and this is passed to the multiplication output port 670. The second multiplication instruction is then passed from the issue flop 610 to the multiplication flop 640. At the same time, the subtraction instruction is passed to the issue flop 610.

In the fifth clock cycle, the result of the second multiplication instruction is passed from the multiplication flop 640 to the multiplication output port 670. The subtraction instruction is passed from the issue flop 610 to the subtraction flop 630. The dummy no-op instruction is received by the issue flop 610.

No further clock cycles occur. In particular the result of the subtraction instruction is passed from the subtraction flop 630 to the subtraction output port 660 in a sixth clock cycle. However, this process does not involve any of the illustrated flops being used. Similarly, the no-op instruction has no effect, and thus nothing is passed from the issue flop 610 in the sixth clock cycle.

Accordingly, it is possible to analyse the use of each of the flops during the execution of the program. In particular, the issue flop 610 is used for four of the five clock cycles (the no-op instruction does not count, as nothing is issued), and so its failure probability is $4/5=0.8$. The addition flop 620 is used for one of the five clock cycles, and so has a failure probability of $1/5=0.2$. The subtraction flop 630 is used for one of the five clock cycles and so has a failure probability of $1/5=0.2$. Finally, the multiplication flop 640 is used for two of the five clock cycles and so has a failure probability of $2/5=0.4$.

FIG. 10 also demonstrates how the instantaneous failure probability can be calculated. In the first clock cycle, one of the four flops contains a valid value, and so the failure probability is $1/4=0.25$. In the second clock cycle, two of the flops contain value values and so the failure probability is $2/4=0.5$. Similarly with the third and fourth clock cycles. In the fifth clock cycle, only one of the four flops contains a valid data value (the issue flop 610 does not count, since it does not contain a real instruction) and so the failure probability is $1/4=0.25$.

FIG. 10 also demonstrates how the failure probability for the circuit can be calculated for the execution of the program illustrated with respect to FIG. 9A. In particular, there are 8 occasions where, during a clock cycle, a flop contains valid data. This is across 20 such occasions (four flops multiplied by five clock cycles). Thus, the failure probability is $8/20=0.4$. Alternatively, the same can be obtained by aggregating the instantaneous failure probabilities (e.g. the mean of $1/4$, $2/4$, $2/4$, $2/4$, and $1/4$ is 0.4) or by aggregating the failure probability of each flop (e.g. the mean of $4/5$, $1/5$, $1/5$, and $2/5$ is again 0.4).

The present technique can also be used in order to determine failure mode distribution of the output ports 650, 660, 670 illustrated in FIG. 9B.

Figure 11:
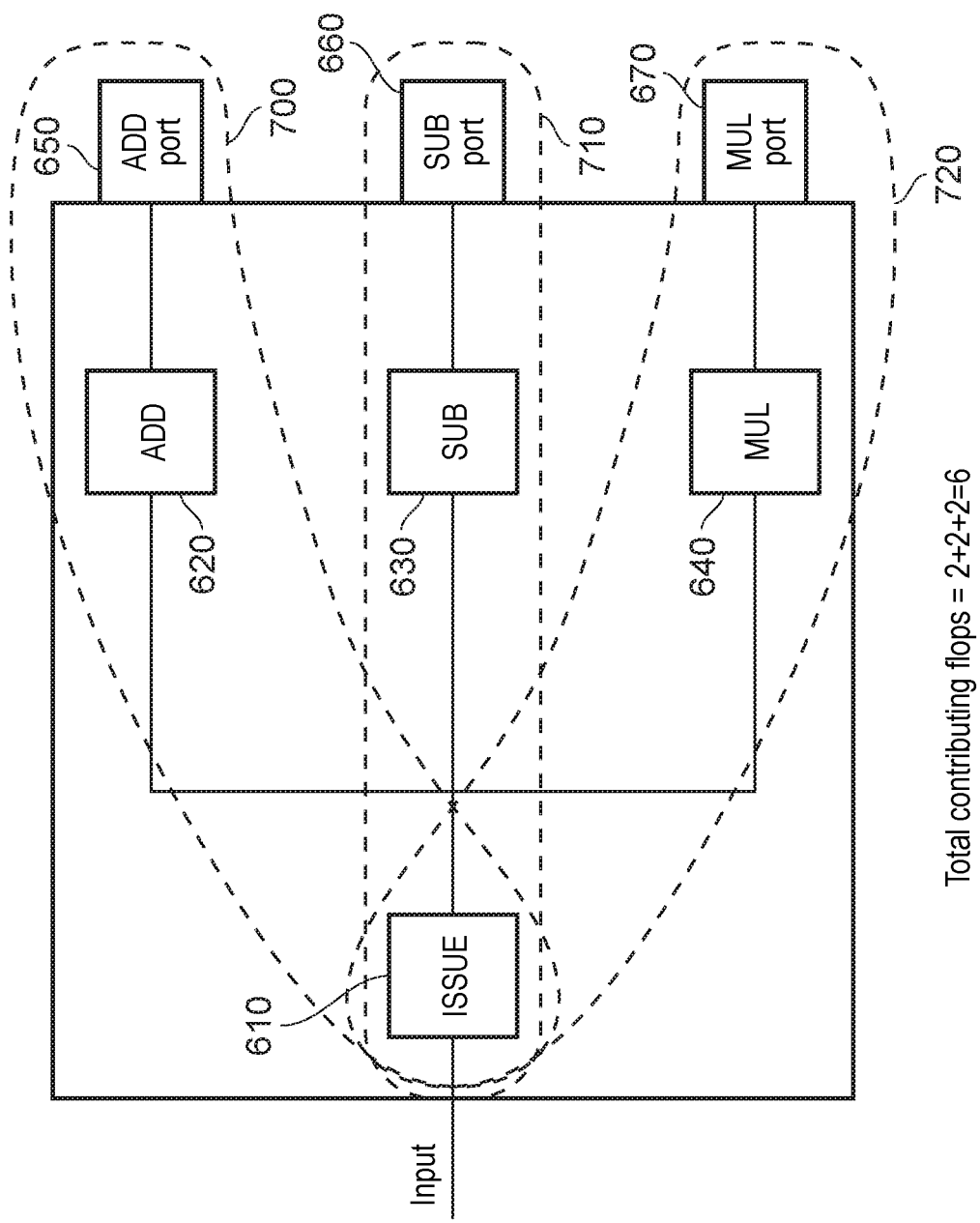
FIG. 11 shows fan-in cones for the circuitry of FIG. 7B in accordance with some embodiments.

FIG. 11 shows fan-in cones for each of the ports 650, 660, 670 which comprise those flops where a change in value of the flop could contribute to a change in the value that is output at one of the corresponding ports 650, 660, 670. For instance, the addition output port 650 defines a first fan-in cone 700 made up from the issue flop 610 and the addition flop 620. Consequently, a change in the value stored at either of these flops results in a change in the value that is output at the addition port 650. Similarly, the subtraction port 660 defines a fan-in code made up from the issue flop 610 and the subtraction flop 630. The multiplication port 670 defines a fan-in cone 720 made up from the issue flop 610 and the multiplication flop 640. This information can be used in recognition of the fact that some flops are relied upon more than others during execution of the application. In particular, if a flop is heavily relied upon then it is more vulnerable during execution of the application. Consequently any of the output ports 650, 660, 670 that relies on such a port is also heavily vulnerable. For the purposes of such calculation, the total number of contributing flops is calculated as the number of contributing flops in each of the fan-in cones 700, 710, 720. In this case, each of the fan-in cones 700, 710, 720 is made up from two flops. Consequently, the total number of contributing flops across all of the output ports 650, 660, 670 is $2+2+2=6$.

Figures 12, 13:
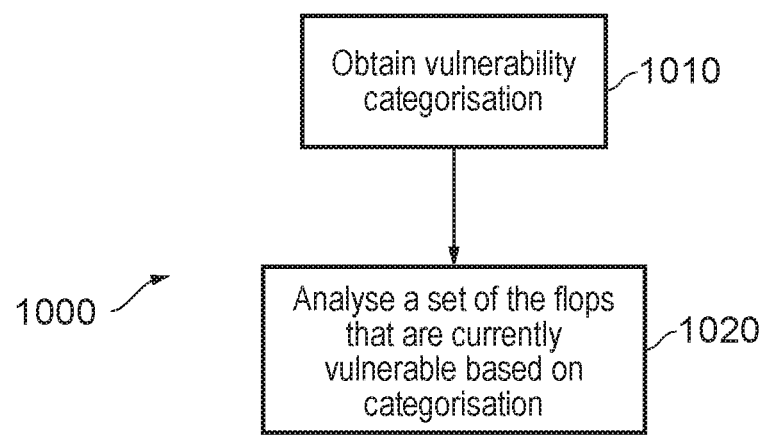
FIG. 12 illustrates how failure mode distribution for each of the ports can be calculated in accordance with some embodiments.
FIG. 13 illustrates a process of analysing the safeness or the vulnerability of a circuit in accordance with some embodiments.

FIG. 12 illustrates how the failure mode distribution for each of the ports can be calculated. The failure mode calculation uses the failure probabilities for each of the flops that were calculated with respect to FIG. 10. These are used together with the fan-in cones 700, 710, and 720. In particular, the fan-in cone 700 for the addition port 650 contains the issue flop 610 and the addition flop 620. The failure probabilities for these flops (0.8 and 0.2 respectively) are added together and divided by the total contributing flops calculated in FIG. 11. The failure mode distribution for the fan-in cone 700 of the addition output port 650 is therefore $(0.8+0.2)/6=1/6$.

Similarly, the failure mode distribution for the subtraction output port 630 is $(0.8+0.2)/6=1/6$ and the failure mode distribution for the multiplication output port 640 is $(0.8+0.4)/6=1/5$.

The failure mode distribution can be used to indicate, for a circuit executing a particular program, the probability with which a transient error can be passed to the corresponding port. In this case, the highest value is associated with the multiplication output port 640. This makes use of the issue flop, which is extensively used, and also the multiplication flop 640 which is used to a higher extent than either the addition flop 620 or the subtraction flop 630.

FIG. 13 illustrates a process of analysing the safeness or the vulnerability of a circuit in accordance with some embodiments in the form of a flow chart 1000. At a step 1010, the vulnerability categorisation of each of the flops in the circuitry is obtained. As has been previously described, this can be achieved using formal methods on analysis of the circuitry representation. At a step 1020, this vulnerability categorisation can be used in order to analyse a set of the flops to determine those flops that are currently vulnerable based on the categorisation that has been obtained can then be used in order to determine the immediate vulnerability of the circuitry, an aggregated immediate vulnerability of the circuitry across a number of cycles, the vulnerability of particular flops, and the failure mode distribution of particular ports that rely on flops as has been previously described.

In some situations, a variance in reliability measurements can occur. As a consequence of, e.g. other masters, interrupts, memory slowdowns, etc. the operation of a processing circuitry tends to be non-deterministic. As a consequence, the extent to which flops are used can vary, even when executing exactly the same program on the processing circuitry. One way to deal with this is to disable (or treat as disabled) certain parts of the processing circuitry. Since fewer parts of the circuitry are active there is less scope for variance in flop usage and measurements of the reliability of a circuit can be more consistent.

Figure 14:
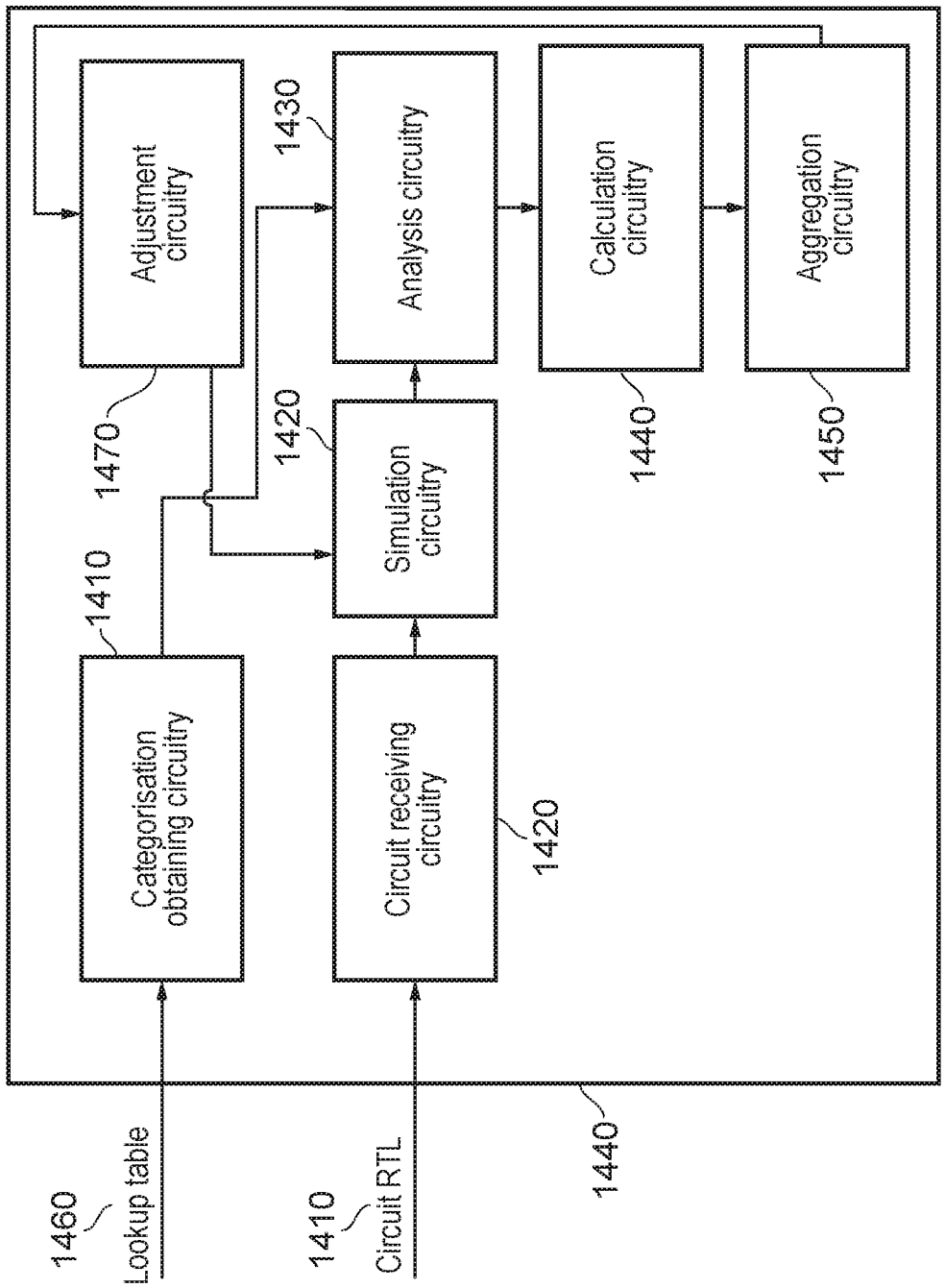
FIG. 14 illustrates an apparatus in the form of host hardware for performing a simulation analysis of the safeness of a circuit, adjusting operation of the circuit, and re-performing the analysis in accordance with some embodiments.

FIG. 14 illustrates an apparatus in accordance with some embodiments. The apparatus includes categorisation obtaining circuitry 1410 to receive a categorisation in the form of a lookup table 1460, and circuit receiving circuitry 1420 to receive a circuit RTL 1410, as previously described. One or more of the simulation circuitry 1420, analysis circuitry 1430, calculation circuitry 1440, and aggregation circuitry 1450 operate to perform a simulation and calculation of the vulnerability of flops during execution of an application by the circuit as previously described. In this situation, however, the result of the calculation is passed to adjustment circuitry 1470. Here, the adjustment circuitry determines whether or not one or more modules or storage circuits within the received circuit 1410 should be disabled. The disabling of components can be achieved in a number of ways. For instance, the circuit RTL 1410 could be modified to remove the modules or storage circuits altogether. In some embodiments, the circuit RTL contains configuration registers, flops, or other elements that can be used to completely disable particular modules or storage circuits and such configuration elements are appropriately signalled at the start of simulation—thereby causing those modules or storage circuits to be disabled. In other embodiments, the circuit RTL 1410 itself may be designed with configuration parameters in mind in order to disable modules or storage circuits. This disabling causes certain flops to be effectively re-categorised as 'isolated' since they form part of a module or storage circuit that will no longer be in use. In any event, the adjustments made are passed to the simulation circuitry 1420 and the simulation is re-performed with certain flops being treated as 'isolated'. Revised values for the reliability are then calculated using the analysis circuitry 1430, calculation circuitry 1440, and aggregation circuitry 1450 as before.

Note that in some embodiments, the categorisation 1460 itself could also be modified to mark particular flops as being isolated.

FIG. 15 illustrates how the adjustment circuitry 1470 can make a determination as to whether a storage circuit or module should be disabled. In particular, FIG. 15 illustrates the calculation of the failure probability (similarly to the F(Vul)(Flop) calculation in FIG. 10), which effectively represents the safeness of each flop. In this example, for simplification, it is assumed that each module comprises a single flop. However, it will be appreciated that the failure probability for specific modules having multiple flops can be calculated be aggregating the failure probabilities of the individual flops as previously described.

In this example, the adjustment circuitry 1470 identifies any component having a failure probability of 20% or under as being a component that can be disabled. This therefore includes the prefetch module (a micro-architectural feature) and the third buffer slot (a storage circuit). As a consequence, these features could be disabled and the calculation re-performed. Note that since these features are disabled, the processing circuitry may not operate as efficiently as if the features were enabled. Hence, it is not appropriate to simply disregard these values when calculating the revised failure probability for the circuit.

Note that in this example, the threshold (20%) is calculated across a single execution. However, in other embodiments, the threshold could be calculated in a different way, such as across a number of executions, using a total, an average, a minimum value, a maximum value, a difference between a maximum and minimum value, or a combination thereof. This is especially helpful when considering stability or variance of the reliability across a number of executions. By disabling such features that have low usage it may be possible to increase the reliability (since fewer flops are in usage). However, since there are fewer flops in use, there is less scope for variation in the flops that are actively used. Consequently, differences in reliability across multiple executions of the processing circuitry can be reduced.

Figure 16:
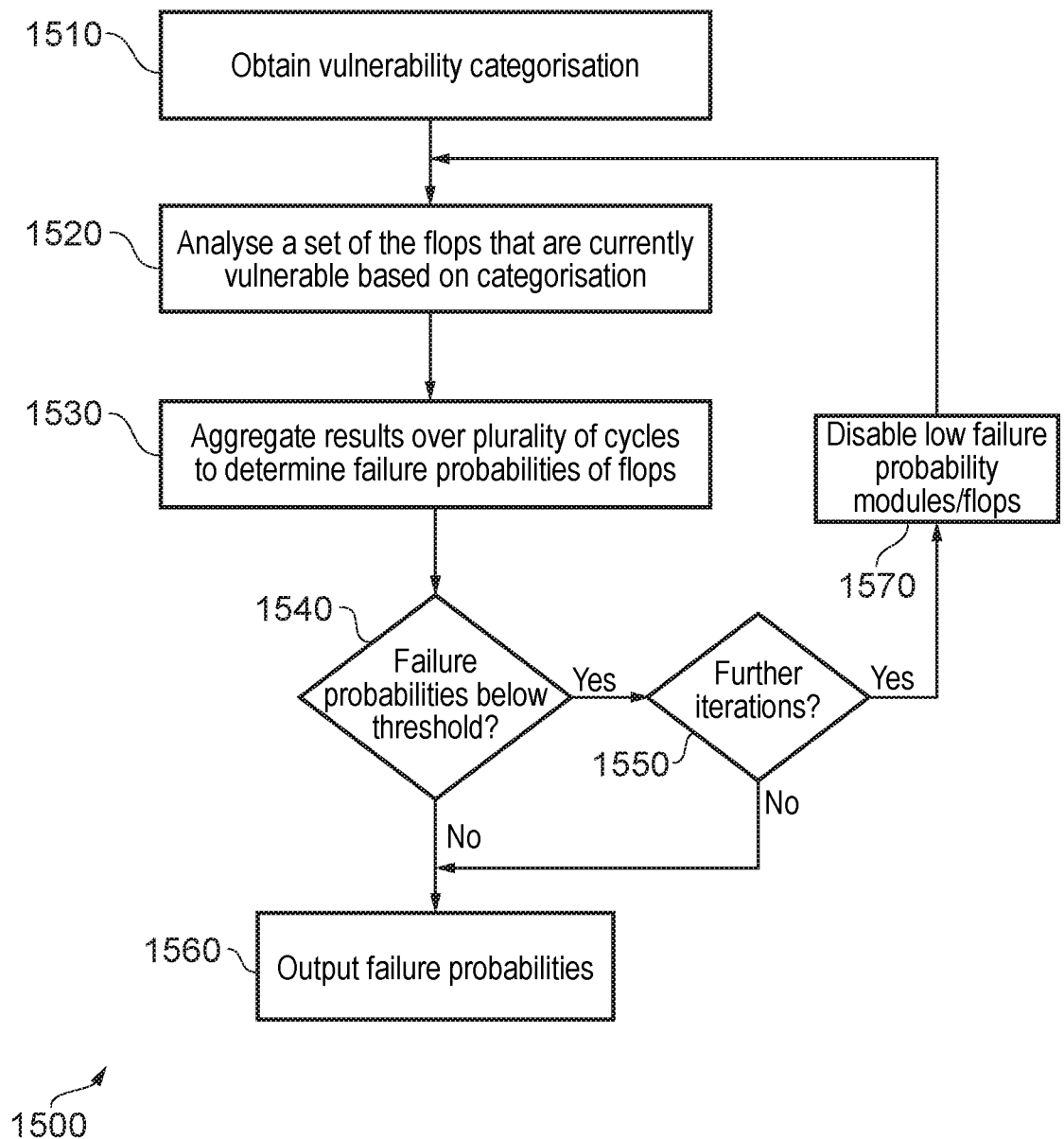
FIG. 16 illustrates a method of data processing in accordance with some embodiments.

FIG. 16 provides a flowchart 1500 that illustrates a method of data processing in accordance with some embodiments. The process starts at a step 1510 in which the vulnerability configuration is obtained. At a step 1520, a set of the flops that are currently vulnerable is determined. This can be achieved via simulation of a processing circuit, which is provided in RTL form. At a particular iteration of the processing circuit, those flops that are vulnerable or that are both conditionally vulnerable and marked as having valid data can be considered to be currently vulnerable. This process is performed over a number of processing cycles and the results aggregated at a step 1530. This therefore provides the failure probability, e.g. F(Vul)(Flop) of each flop. At a step 1540, it is determined whether any of the failure probabilities is below a threshold. If not, then the failure probabilities are output (e.g. the safeness of each flop is output) at step 1560. If so, then at step 1550, it is determined if further iterations of the refinement/re-calculation/re-determination process are to be performed. If not, then the process proceeds to step 1560 where the failure probabilities are output. If so, then at step 1570, the modules or flops having failure probability below the threshold are disabled and the process returns to step 1520 where the simulation and calculation are performed again with the low failure probability modules disabled (thereby causing those flops to be 'isolated'). Note that this process allows for the adjustment process to be repeatedly performed if, for instance, disabling one module causes another module to become under-used.

The present techniques may also be applicable to one or more of the following configurations:

1. An apparatus to measure vulnerability of a circuit to transient errors, the circuit comprising processing circuitry and a plurality of flops, the apparatus comprising:
   categorisation obtaining circuitry to obtain a vulnerability categorisation of the flops, wherein the vulnerability categorisation indicates whether each flop is vulnerable, conditionally vulnerable, or isolated; and
   analysis circuitry to determine, for one cycle of the processing circuitry, a set of the flops that are currently vulnerable, based on the vulnerability categorisation of the flops.
2. The apparatus according to clause 1, wherein
   the categorisation obtaining circuitry is adapted to obtain, for each conditionally vulnerable flop in the flops, a corresponding flop or signal that indicates whether that conditionally vulnerable flop contains valid data.
3. The apparatus according to clause 1, wherein
   the categorisation obtaining circuitry is adapted to obtain a lookup table that indicates, for each conditionally vulnerable flop in the flops, the corresponding flop or signal that indicates whether that conditionally vulnerable flop contains valid data.
4. The apparatus according to clause 1, wherein
   the analysis circuitry is adapted to determine a number of the flops that are currently vulnerable.
5. The apparatus according to clause 4, wherein
   the analysis circuitry is adapted to determine that a given flop is currently vulnerable when:
   the given flop is categorised as vulnerable in the vulnerability categorisation, or
   the given flop is categorised as conditionally vulnerable and the corresponding flop or signal indicates that the given flop contains valid data.
6. The apparatus according to clause 4, wherein
   the analysis circuitry is adapted to determine that a given flop is currently vulnerable if:
   the given flop is categorised as vulnerable in the vulnerability categorisation, or
   the given flop is categorised as conditionally vulnerable and the corresponding flop or signal indicates that the given flop contains valid data,
   otherwise the given flop is not currently vulnerable.

7. The apparatus according to clause 4, comprising:
calculation circuitry to calculate an instantaneous failure probability of the circuit, using the number of the flops that are currently vulnerable and a total number of the flops.

8. The apparatus according to clause 7, comprising:
aggregation circuitry to produce an aggregate of the instantaneous failure probability of the circuit across a plurality of cycles of the processing circuitry.

9. The apparatus according to clause 1, comprising:
circuit receiving circuitry to receive a representation of the circuit; and
simulation circuitry to provide, using the representation of the circuit, an instruction environment corresponding to the processing circuitry of the circuit and to simulate the one cycle of the processing circuitry, wherein
the analysis circuitry determines the set of the flops that are currently vulnerable, using the representation of the circuit.

10. The apparatus according clause 1, wherein
the circuit is adapted to execute an application for a plurality of cycles of the processing circuitry; and
the analysis circuitry is adapted to determine, for each of at least some of the flops, a number of the plurality of cycles for which that flop is vulnerable during execution of the application by the processing circuitry, based on the vulnerability categorisation of the flops.

11. The apparatus according to clause 10, wherein
the analysis circuitry is adapted to determine, for each of at least some of the flops, a failure probability of one of the flops by determining a ratio of the number of the plurality of cycles for which the one of the flops is vulnerable to the number of the plurality of cycles, during execution of the application by the processing circuitry.

12. The apparatus according to clause 11, comprising:
aggregation circuitry to produce an aggregate of the failure probability of the one of the flops across the plurality of flops.

13. The apparatus according to clause 12, wherein
the analysis circuitry is adapted to determine a failure mode distribution of an output port of the circuit based on the failure probability of contributing flops of the output port during execution of the application by the processing circuitry.

14. The apparatus according to clause 13, wherein
the contributing flops comprise those flops for which a changed value has potential to cause a change in an output at the output port.

15. The apparatus according to clause 13, wherein
the contributing flops comprise those flops that at least indirectly provide data to the output port.

16. The apparatus according to clause 13, wherein
failure mode distribution of the output port is based on the sum of the failure probability of the contributing flops of the output port and a total of the contributing flops for each output port in the circuit.

17. The apparatus according to clause 1, wherein
the apparatus is a hardware monitor; and the analysis circuitry is adapted to access the flops of the circuit during the one cycle.

18. A method of measuring vulnerability of a circuit to transient errors, the circuit comprising processing circuitry and a plurality of flops, the method comprising:
obtaining a vulnerability categorisation of the flops, wherein the vulnerability categorisation indicates whether each flop is vulnerable, conditionally vulnerable, or isolated from transient errors; and
analysing, for one cycle of the processing circuitry, a set of the flops that are currently vulnerable, based on the vulnerability categorisation of the flops.

19. A non-transient computer readable medium containing program instructions for causing a computer to perform a method of measuring vulnerable of a circuit to transient errors, the circuit comprising processing circuitry and a plurality of flops, the method comprising:
obtaining a vulnerability categorisation of the flops, wherein the vulnerability categorisation indicates whether each flop is vulnerable, conditionally vulnerable, or isolated from transient errors; and
analysing, for one cycle of the processing circuitry, a set of the flops that are currently vulnerable, based on the vulnerability categorisation of the flops.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

We claim:

1. An apparatus to measure vulnerability of a circuit to transient errors, the circuit comprising processing circuitry and a plurality of flops, the apparatus comprising:
categorisation obtaining circuitry to obtain a vulnerability categorisation of the flops, wherein the vulnerability categorisation indicates whether each flop is vulnerable, conditionally vulnerable, or isolated; and
analysis circuitry to determine, for at least one cycle of the processing circuitry, a set of the flops that are currently vulnerable, based on the vulnerability categorisation of the flops.

2. The apparatus according to claim 1, further comprising:
adjustment circuitry to perform re-categorisation, in response to at least one requirement, of an initially conditionally vulnerable flop in the flops to be isolated and to cause the set of flops that are currently vulnerable to be re-determined.

3. The apparatus according to claim 2, wherein
the adjustment circuitry is to perform the re-categorisation by disabling a module of the processing circuitry and re-determining the set of flops that are currently vulnerable for the at least one cycle with the module disabled; and
the module comprises the conditionally vulnerable flop.

4. The apparatus according to claim 3, wherein
the module is micro-architectural.

5. The apparatus according to claim 3, wherein
the module is storage circuitry.

6. The apparatus according to claim 2, wherein
the categorisation obtaining circuitry is adapted to obtain, for each conditionally vulnerable flop in the flops, a corresponding flop or signal that indicates whether that conditionally vulnerable flop contains valid data.

7. The apparatus according to claim 2, wherein
the analysis circuitry is adapted to determine that a given flop is currently vulnerable when:
the given flop is categorised as vulnerable in the vulnerability categorisation, or
the given flop is categorised as conditionally vulnerable and the corresponding flop or signal indicates that the given flop contains valid data.

8. The apparatus according to claim 7, wherein
the adjustment circuitry is adapted to cause the set of flops that are currently vulnerable to be re-determined by the analysis circuitry after the re-categorisation has occurred.

9. The apparatus according to claim 2, further comprising:
calculation circuitry to calculate an instantaneous failure probability of the circuit, using the number of the flops that are currently vulnerable and a total number of the flops.

10. The apparatus according to claim 9, further comprising:
aggregation circuitry to produce an aggregate of the instantaneous failure probability of the circuit across a plurality of cycles of the processing circuitry.

11. The apparatus according to claim 2, further comprising:
circuit receiving circuitry to receive a representation of the circuit; and
simulation circuitry to provide, using the representation of the circuit, an instruction environment corresponding to the processing circuitry of the circuit and to simulate the at least one cycle of the processing circuitry, wherein
the analysis circuitry determines the set of the flops that are currently vulnerable, using the representation of the circuit.

12. The apparatus according claim 2, wherein
the circuit is adapted to execute an application for a plurality of cycles of the processing circuitry; and
the analysis circuitry is adapted to determine, for each of at least some of the flops, a number of the plurality of cycles for which that flop is vulnerable during execution of the application by the processing circuitry, based on the vulnerability categorisation of the flops.

13. The apparatus according to claim 12, wherein
the analysis circuitry is adapted to determine, for each of at least some of the flops, a failure probability of one of the flops by determining a ratio of the number of the plurality of cycles for which the one of the flops is vulnerable to the number of the plurality of cycles, during execution of the application by the processing circuitry.

14. The apparatus according to claim 13, wherein
the at least one requirement comprises a requirement that the failure probability of the conditionally vulnerable flop is below a threshold.

15. The apparatus according to claim 13, further comprising:
aggregation circuitry to produce an aggregate of the failure probability of the one of the flops across the plurality of flops.

16. The apparatus according to claim 15, wherein
the analysis circuitry is adapted to determine a failure mode distribution of an output port of the circuit based on the failure probability of contributing flops of the output port during execution of the application by the processing circuitry; and
failure mode distribution of the output port is based on the sum of the failure probability of the contributing flops of the output port and a total of the contributing flops for each output port in the circuit.

17. The apparatus according to claim 16, wherein
the contributing flops comprise those flops for which a changed value has potential to cause a change in an output at the output port.

18. The apparatus according to claim 16, wherein
the contributing flops comprise those flops that at least indirectly provide data to the output port.

19. A method of measuring vulnerability of a circuit to transient errors, the circuit comprising processing circuitry and a plurality of flops, the method comprising:
obtaining a vulnerability categorisation of the flops, wherein the vulnerability categorisation indicates whether each flop is vulnerable, conditionally vulnerable, or isolated; and
analysing, for at least one cycle of the processing circuitry, a set of the flops that are currently vulnerable, based on the vulnerability categorisation of the flops.

20. A non-transient computer readable medium containing program instructions for causing a computer to perform a method of measuring vulnerable of a circuit to transient errors, the circuit comprising processing circuitry and a plurality of flops, the method comprising:
obtaining a vulnerability categorisation of the flops, wherein the vulnerability categorisation indicates whether each flop is vulnerable, conditionally vulnerable, or isolated; and
analysing, for at least one cycle of the processing circuitry, a set of the flops that are currently vulnerable, based on the vulnerability categorisation of the flops.

* * * * *